(12) United States Patent
Lee

(10) Patent No.: US 6,750,615 B2
(45) Date of Patent: Jun. 15, 2004

(54) PLASMA APPARATUS INCLUDING PLASMA-MEASURING DEVICE

(75) Inventor: Jeon-Beom Lee, Gwangjoo-gun (KR)

(73) Assignee: Jusung Engineering Co., LTD, Gyeonggi-do (KR)

(*) Notice: Subject to any disclaimer, the term of this patent is extended or adjusted under 35 U.S.C. 154(b) by 0 days.

(21) Appl. No.: 10/386,817

(22) Filed: Mar. 12, 2003

(65) Prior Publication Data

US 2003/0183336 A1 Oct. 2, 2003

(30) Foreign Application Priority Data

Mar. 27, 2002 (KR) .................... 10-2002-0016852

(51) Int. Cl.$^7$ ................................. H01J 7/24
(52) U.S. Cl. ................ 315/111.21; 315/111.41; 315/111.71
(58) Field of Search .............. 315/111.21, 111.71, 315/111.41

(56) References Cited

U.S. PATENT DOCUMENTS 5,081,398 A * 1/1992 Asmussen et al. ...... 315/111.41
6,339,297 B1 * 1/2002 Sugai et al. ............ 315/111.21

* cited by examiner

Primary Examiner—David Vu
(74) Attorney, Agent, or Firm—Baker & Daniels

(57) ABSTRACT

A plasma apparatus of fabricating a semiconductor device includes: a chamber including a reaction region; a chuck in the reaction region; and a plasma-measuring device on a top surface of the chuck, comprising: a probing plate including a plurality of probes on a top surface thereof; and a detecting plate under the probing plate, the detecting plate including a plurality of detecting portions corresponding to the plurality of probes, the plurality of detecting portions being electrically connected to the plurality of probes.

16 Claims, 2 Drawing Sheets

PLASMA APPARATUS INCLUDING PLASMA-MEASURING DEVICE

This application claims the benefit of Korean Patent Application No. 2002-16852, filed on Mar. 27, 2002 in Korea, which is hereby incorporated by reference for all purposes as if fully set forth herein.

BACKGROUND OF THE INVENTION

1. Field of the Invention

The present invention relates to a plasma apparatus and more particularly, to a plasma-measuring device to measure plasma generated at a chamber of the plasma apparatus.

2. Discussion of the Related Art

Recently, a new material field for development and treatment of new materials has been rapidly grown as science is developed, and results of the new material field become a driving force of development in a semiconductor industry.

A semiconductor device is a large scale integrated circuit (LSI) which is fabricated through subsequent deposition and patterning processes of thin films on a substrate, and theses processes are performed in a process module for a semiconductor device including a chamber which is a closed reaction vessel.

In processes of fabricating a semiconductor device, increase of production yield and improvement of quality have been incessantly pursued through enlargement of a substrate and fine resolution. Accordingly, a fabricating method of a semiconductor using plasma is suggested, and an ultra large scale integrated circuit (ULSI) is developed by using this fabricating method. For the fabricating method using plasma, a plasma-generating source is additionally installed in a process module for a semiconductor device, especially in a chamber, and a substrate is treated with plasma generated from the plasma-generating source. The plasma-generating source is classified into several types according to a principle of generating plasma.

Among the several types of plasma-generating source, a capacitively coupled plasma (CCP) type plasma-generating source and an inductively coupled plasma (ICP) type plasma-generating source are widely used for a fabricating process of a semiconductor device. In the CCP type plasma-generating source, two conductive plates are disposed parallel and spaced apart from each other. One conductive plate is grounded and the other conductive plate is connected to a power supply having a high frequency. Plasma is generated when gaseous materials pass through a space between two conductive plates. In ICP type plasma-generating source, plasma is generated through applying a time-varying electromagnetic field in a region having gaseous materials. In both of CCP and ICP types, a substrate is treated in a chamber having plasma generated from the plasma-generating source.

When a semiconductor device is fabricated in a chamber having a plasma-generating source, reaction conditions including a pressure and a temperature of the chamber are adjusted for reliable process and an interior of the chamber forms a separate reaction system independent of an exterior of the chamber. Generally, since the chamber is made of metallic material of low cost such as stainless steel and aluminum, it is difficult to detect a plasma state generated in the chamber. Moreover, since high cleanness is required in the fabricating processes of a semiconductor device to minimize a contamination by impurities, a process module includes a plurality of clean spaces. Accordingly, it is more difficult to detect the plasma state generated in the chamber during the fabricating processes.

To solve this problem, a method of detecting a plasma state by using electric characteristics of plasma according to a related art has been suggested. In the method according to a related art, a probe of metallic material is inserted into the chamber including plasma and a voltage is applied to the probe. The quantity of a feedback current generated from plasma colliding with the probe is measured. Accordingly, the plasma state is indirectly detected by using at least one probe inserted into the chamber or by scanning the interior of the chamber with a sensing element of rod shape having at least one probe. However, the plasma state of only a partial portion can be detected through the method according to a related art. Therefore, a plasma state adjacent to the substrate and each plasma state according to a position over one substrate can not be detected.

SUMMARY OF THE INVENTION

Accordingly, the present invention is directed to a plasma apparatus including a plasma-measuring device that substantially obviates one or more of problems due to limitations and disadvantages of the related art.

An object of the present invention is to provide a plasma apparatus including a plasma-measuring device that can detect a plasma state of a portion adjacent to a substrate where a fabricating process is performed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a plasma apparatus of fabricating a semiconductor device includes: a chamber including a reaction region; a chuck in the reaction region; and a plasma-measuring device on a top surface of the chuck, comprising: a probing plate including a plurality of probes on a top surface thereof, and a detecting plate under the probing plate, the detecting plate including a plurality of detecting portions corresponding to the plurality of probes, the plurality of detecting portions being electrically connected to the plurality of probes.

The plasma apparatus further includes a plasma-generating source over the reaction region and the plasma-generating source includes a first radio frequency (RF) power supply, a first impedance-matching unit and a load.

The first RF power supply supplies a power of high frequency, the first impedance-matching unit matches an impedance of the power supplied from the first RF power supply, the load generates a time-varying electromagnetic field, and the time-varying electromagnetic field generates plasma in the reaction region.

The plasma apparatus further includes a bias source attached to the chamber and the bias source includes a bias electrode in the chuck, a second impedance-matching unit and a second RF power supply. The plurality of probes attracts and collides with ions of the plasma to generate a current and the current is transmitted to the plurality of detecting portions.

The plasma-measuring device further includes a supporting plate between the detecting plate and the chuck and the supporting plate includes a hole at a center thereof.

The plasma-measuring device further includes a plurality of lines extending from a bottom surface of the detecting plate through the hole and the plurality of lines is electrically connected to the plurality of detecting portions, respectively.

The detecting plate has the same shape as a top surface of the chuck. The plurality of probes includes one of tungsten and platinum and has one shape of pin and button. A number of the plurality of probes is one of 9, 25 and 49.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

A plasma-measuring device according to the present invention is disposed on a chuck in a chamber of a plasma apparatus instead of a substrate and a plasma state is instantaneously measured during a fabricating process of a semiconductor device. For illustration of the plasma-measuring device according to the present invention, an etcher including a plasma-generating source of inductively coupled plasma (ICP) type is used as an example of a plasma apparatus. The plasma-measuring device according to the present invention can be applied to a plasma apparatus of the other type.

Figure 1:
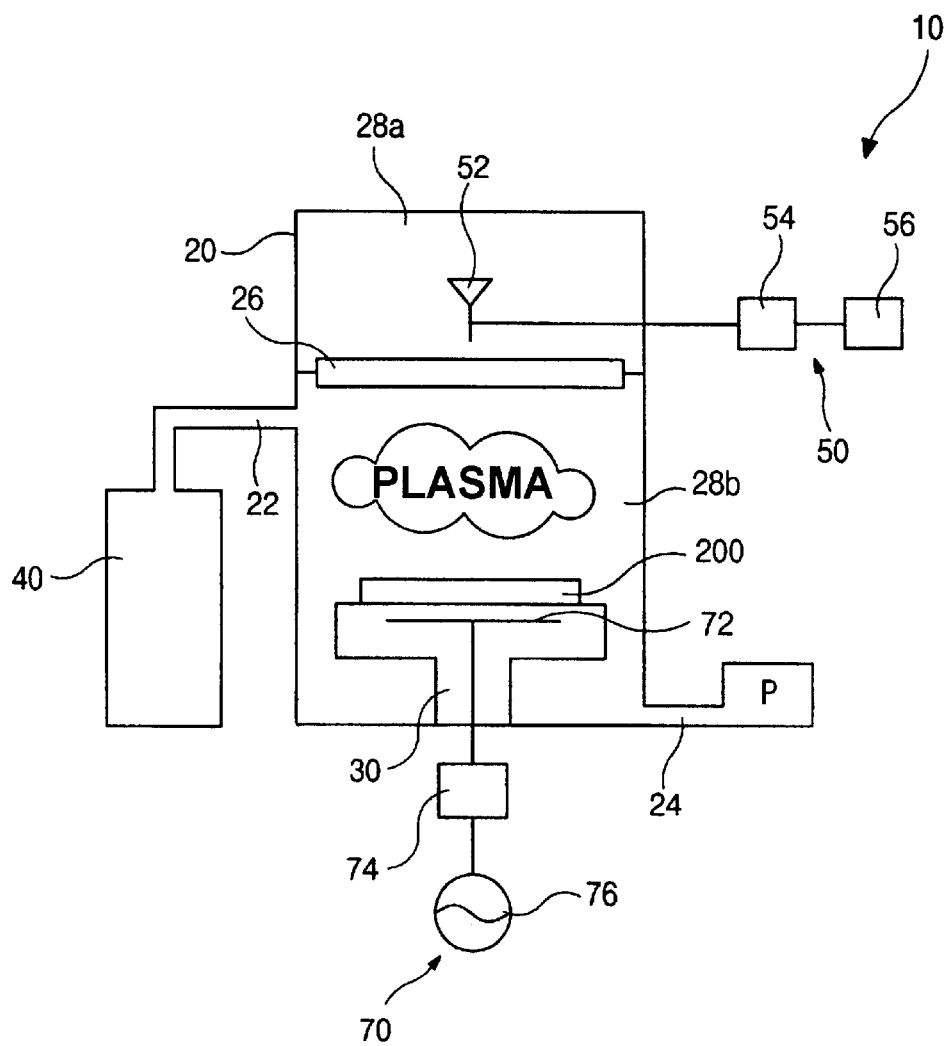
FIG. 1 is a schematic diagram showing a plasma apparatus including a plasma-measuring device according to an embodiment of the present invention.

FIG. 1 is a schematic diagram showing a plasma apparatus including a plasma-measuring device according to an embodiment of the present invention. As shown in FIG. 1, a plasma apparatus 10 includes a chamber 20 and a supply unit 40. The chamber 10 is a closed reaction vessel in which a thin film formed on a substrate is directly treated and processed. Necessary materials such as source and reaction materials for a process of the chamber 20 are stored in the supply unit 40 and supplied to the chamber 20. The chamber 20 includes an injection tube 22 through which the necessary materials are supplied from the supply unit 40 to the chamber 20. An interior of the chamber 20 is divided into first and second regions 28a and 28b by an insulating plate 26. A plasma-generating source 50 or a portion of the plasma-generating source 50 is installed in the first region 28a and a chuck 30 is installed in the second region 28b. A plasma-measuring device 200 is disposed on the chuck instead of a substrate. After the source and reaction materials stored in the supply unit 40 are injected into the chamber 20, a time-varying electromagnetic field generated by the plasma-generating source 50 are applied to the injected source and reaction materials of gaseous phase to generate plasma in the second region 28b. When the plasma is generated, the plasma-measuring device 200 instantaneously measures a plasma state such as plasma density, plasma temperature and plasma potential.

The plasma-generating source 50 includes a first radio frequency (RF) power supply 56 supplying a power of high frequency, a first impedance-matching unit 54 matching an impedance of the power supplied from the first RF power supply 56 and a load 52 generating the time-varying electromagnetic field such as an antenna and a conductive plate. The antenna is not used in a narrow sense but in a broad sense. Thus, the antenna means not an element transmitting and receiving signals in wireless communication but an element emitting a power to a space.

Preferably, a bias source 70 adjusting impact energy of the plasma is added to the chamber 20. The bias source 70 includes a bias electrode 72 in the chuck 30, a second impedance-matching unit 74 and a second RF power supply 76.

Figure 2:
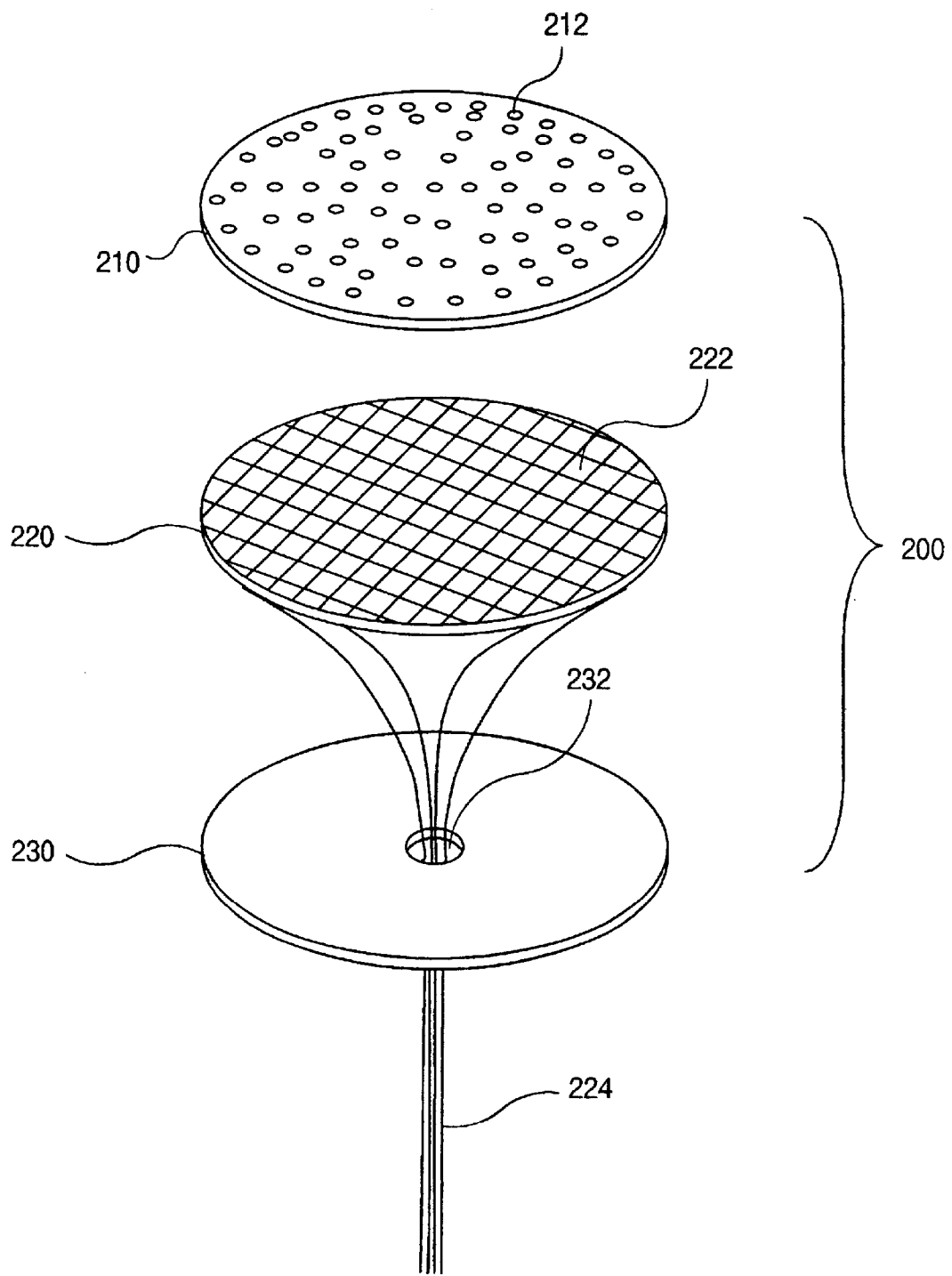
FIG. 2 is a schematic decomposed perspective view of a plasma-measuring device according to an embodiment of the present invention.

A detail structure of the plasma-measuring device 200 is illustrated in FIG. 2.

FIG. 2 is a schematic decomposed perspective view of a plasma-measuring device according to an embodiment of the present invention. As shown in FIG. 2, a plasma-measuring device 200 includes a supporting plate 230, a detecting plate 220 and a probing plate 210 sequentially disposed on a top surface of the chuck 30 (of FIG. 1). Preferably, the supporting plate 230, the detecting plate 220 and the probing plate 210 have the same shape as the top surface of the chuck 30 (of FIG. 1) or a substrate (not shown).

A plurality of probes 212 formed on the probing plate 210 is made of a metallic material such as tungsten (W) and platinum (Pt). The plurality of probes 212 can be formed in a pin shape or in a little button shape as shown in FIG. 2. A number of the plurality of probes 212 can be adjusted according to an object. For example, when the plurality of probes 212 is formed to correspond to measuring points for uniformity of a thin film on the substrate, the number of the plurality of probes 212 is one of 9, 25 and 49. When a bias is applied to the plurality of probes 212 through the detecting plate 220, each probe 212 attracts and collides with the plasma ions to generate a current. The generated current is returned to the detecting plate 220.

The detecting plate 220 under the probing plate 210 includes a plurality of detecting portions 222 corresponding to and electrically connected to the plurality of probes 212. Each detecting portion 222 transmits the bias applied from an external system to the corresponding probe 212 and detects the current generated at the corresponding probe 212 as a sensor. Accordingly, a plurality of lines 224 is electrically connected to the plurality of detecting portions 222 and extends from a bottom surface of the detecting plate 220. Even though the plurality of lines 224 is shown to be fewer than the plurality of detecting portions 222 in FIG. 2 for convenience, the plurality of lines 224 has the same number as the plurality of detecting portions 222 and the plurality of probes 212.

The supporting plate 230 is disposed under the detecting plate 220. Even though the supporting plate 230 is not an essential element of the plasma-measuring device according to the present invention, the supporting plate 230 functions as a base supporting the detecting plate 220 and the probing plate 210. The supporting plate 230 includes a supporting plate hole 232 through which the plurality of lines 224 extends from the bottom surface of the detecting plate 220 to an exterior of the chamber 20 (of FIG. 1). After electrical signals indicating the plasma state such as plasma density, plasma temperature and plasma potential are obtained at the probing plate 210, the electrical signals are transmitted to a data acquisition (DAQ) system at one end of the plurality of lines 224. Therefore, users can verify the plasma state from the DAQ system easily.

The plasma-measuring device in the chamber of the plasma apparatus is disposed on the top surface of the chuck where a substrate is loaded. Therefore, the plasma-measuring device can measure the plasma state which the substrate experiences. Moreover, the plasma states of the plurality of detecting portions corresponding to the plurality of probes are instantaneously measured at the same time. Furthermore, since the number and the position of the plurality of detecting portions can be varied, information of an entire surface of the substrate is obtained and a fabricating process of a semiconductor device is improved.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A plasma apparatus of fabricating a semiconductor device, comprising:
    a chamber including a reaction region;
    a chuck in the reaction region; and
    a plasma-measuring device on a top surface of the chuck, comprising:
        a probing plate including a plurality of probes on a top surface thereof; and
        a detecting plate under the probing plate, the detecting plate including a plurality of detecting portions corresponding to the plurality of probes, the plurality of detecting portions being electrically connected to the plurality of probes.

2. The plasma apparatus according to claim 1, further comprising a plasma-generating source over the reaction region.

3. The plasma apparatus according to claim 2, wherein the plasma-generating source includes a first radio frequency (RF) power supply, a first impedance-matching unit and a load.

4. The plasma apparatus according to claim 3, wherein the first RF power supply supplies a power of high frequency, wherein the first impedance-matching unit matches an impedance of the power supplied from the first RF power supply, wherein the load generates a time-varying electromagnetic field, wherein the time-varying electromagnetic field generates plasma in the reaction region.

5. The plasma apparatus according to claim 4, further comprising a bias source attached to the chamber.

6. The plasma apparatus according to claim 5, wherein the bias source includes a bias electrode in the chuck, a second impedance-matching unit and a second RF power supply.

7. The plasma apparatus according to claim 6, wherein the plurality of probes attracts and collides with ions of the plasma to generate a current.

8. The plasma apparatus according to claim 7, wherein the current is transmitted to the plurality of detecting portions.

9. The plasma apparatus according to claim 1, wherein the plasma-measuring device further includes a supporting plate between the detecting plate and the chuck.

10. The plasma apparatus according to claim 9, wherein the supporting plate includes a hole at a center thereof.

11. The plasma apparatus according to claim 10, wherein the plasma-measuring device further includes a plurality of lines extending from a bottom surface of the detecting plate through the hole.

12. The plasma apparatus according to claim 11, wherein the plurality of lines is electrically connected to the plurality of detecting portions, respectively.

13. The plasma apparatus according to claim 1, wherein the detecting plate has the same shape as a top surface of the chuck.

14. The plasma apparatus according to claim 1, wherein the plurality of probes includes one of tungsten and platinum.

15. The plasma apparatus according to claim 1, wherein the plurality of probes has one shape of pin and button.

16. The plasma apparatus according to claim 1, wherein a number of the plurality of probes is one of 9, 25 and 49.

* * * * *